(12) United States Patent
Maeda

(10) Patent No.: US 12,358,012 B2
(45) Date of Patent: Jul. 15, 2025

(54) INJECTION DEVICE AND INJECTION METHOD

(71) Applicant: Mitsubishi Electric Corporation, Tokyo (JP)

(72) Inventor: Hiroaki Maeda, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 567 days.

(21) Appl. No.: 16/159,744

(22) Filed: Oct. 15, 2018

(65) Prior Publication Data

US 2019/0275552 A1    Sep. 12, 2019

(30) Foreign Application Priority Data

Mar. 12, 2018 (JP) ................. 2018-044294

(51) Int. Cl.
*B05B 17/06* (2006.01)
*B05B 1/16* (2006.01)
*B05B 7/14* (2006.01)
*B05B 17/00* (2006.01)

(52) U.S. Cl.
CPC ............ *B05B 17/0623* (2013.01); *B05B 1/16* (2013.01); *B05B 7/1418* (2013.01); *B05B 17/0646* (2013.01)

(58) Field of Classification Search
CPC ............ B05B 17/0615; B05B 17/0623; B05B 17/0646; B05B 1/16; B05B 7/1418; B05B 17/06–0684; B05B 17/0653; B05B 17/0676; A61M 11/005; A61M 15/001; A61M 15/0085; B41J 2/14201; B41J 29/02

USPC .................... 239/102.1, 102.2; 361/689–700
See application file for complete search history.

(56) References Cited

U.S. PATENT DOCUMENTS

| | | | |
|---|---|---|---|
| 4,733,820 A | | 3/1988 | Endo et al. |
| 7,688,583 B1 * | | 3/2010 | Arik .......................... F15D 1/00 361/689 |
| 2004/0135858 A1 * | | 7/2004 | Usui .......................... B41J 2/19 347/92 |
| 2005/0136190 A1 * | | 6/2005 | Tani ....................... B05B 3/1014 427/421.1 |

(Continued)

FOREIGN PATENT DOCUMENTS

| | | |
|---|---|---|
| DE | 102 48 106 A1 | 5/2004 |
| JP | H01-284364 A | 11/1989 |

(Continued)

OTHER PUBLICATIONS

An Office Action; "Notice of Reasons for Refusal," mailed by the Japanese Patent Office on May 7, 2021, which corresponds to Japanese Patent Application No. 2018-044294 and is related to U.S. Appl. No. 16/159,744 with English language translation.

(Continued)

*Primary Examiner* — Arthur O. Hall
*Assistant Examiner* — Juan C Barrera
(74) *Attorney, Agent, or Firm* — Studebaker Brackett PLLC

(57) ABSTRACT

An injection device includes: an injection nozzle injecting an injection agent into a target container, and a vibration generating device vibrating the injection nozzle in a plurality of directions during injection of the injection agent.

18 Claims, 3 Drawing Sheets

(56) References Cited

U.S. PATENT DOCUMENTS

2008/0265056 A1* 10/2008 Quan .................. B05B 17/0669
                                                                239/102.2
2010/0055299 A1*  3/2010 Church ............. H01L 21/67126
                                                                118/664
2018/0207030 A1*  7/2018 Ivri ....................... B05B 9/0838

FOREIGN PATENT DOCUMENTS

| JP | H11-245006 A | 9/1999 | | |
|----|--------------|--------|---|---|
| JP | 2002-320894 A | 11/2002 | | |
| JP | 2007-167791 A | 7/2007 | | |
| KR | 10-0853863 B1 | 8/2008 | | |
| WO | WO 2010052388 A1 * | 5/2010 | .............. | B01F 11/02 |

OTHER PUBLICATIONS

An Office Action mailed by China National Intellectual Property Administration on Oct. 11, 2022, which corresponds to Chinese Patent Application No. 201910171841.1 and is related to U.S. Appl. No. 16/159,744; with English language translation.

An Office Action issued by the German Patent and Trade Mark Office on Oct. 27, 2022, which corresponds to German Patent Application No. 102018221001.2 and is related to U.S. Appl. No. 16/159,744; with English language translation.

An Office Action mailed by China National Intellectual Property Administration on Mar. 31, 2023, which corresponds to Chinese Patent Application No. 201910171841.1 and is related to U.S. Appl. No. 16/159,744; with English language translation.

* cited by examiner

CORNER

INJECTION DEVICE AND INJECTION METHOD

BACKGROUND OF THE INVENTION

Field

The present invention relates to an injection device and an injection method injecting an injection agent into a target container.

BACKGROUND

When a large amount of liquid injection agent is injected into a target container, it takes time for the injection material to spread in the target container, which hence results in a long injection time. Moreover, depending on the internal structure of the target container, large bubbles have been to remain in the target container after injection. A highly viscous injection agent particularly has poor fluidity, which hence causes its slow spreading and much remaining of such bubbles. Against this, there is proposed a technology in which an injection nozzle is vibrated in one direction during injection of an injection agent (for example, see JP H01-284364 A).

SUMMARY

However, only with the one directional vibration of the injection nozzle, the injection agent is hard to enter the corner of the target container or the four corners of a box-shaped target container, which problematically causes remaining of bubbles in the target container after injection.

The present invention is devised in order to solve the aforementioned problems, and an object thereof is to obtain an injection device and an injection method capable of reducing an injection time and suppressing remaining of bubbles.

According to the present invention, an injection device includes: an injection nozzle injecting an injection agent into a target container; and a vibration generating device vibrating the injection nozzle in a plurality of directions during injection of the injection agent.

In the present invention, the vibration generating device vibrates the injection nozzle in a plurality of directions during injection of the injection agent. The injection agent is thereby vibrated to form waves therein, which thereby leads to good fluidity thereof even when the injection agent is highly viscous. Accordingly, since the injection agent rapidly spreads, an injection time of a highly viscous injection agent can be reduced. Since the injection agent easily enters the corner of the target container and the four corners of the box-shaped target container, bubbles can be suppressed from remaining in the target container.

Other and further objects, features and advantages of the invention will appear more fully from the following description.

DESCRIPTION OF EMBODIMENTS

An injection device and an injection method according to the embodiments of the present invention will be described with reference to the drawings. The same components will be denoted by the same symbols, and the repeated description thereof may be omitted.

First Embodiment

Figure 1:
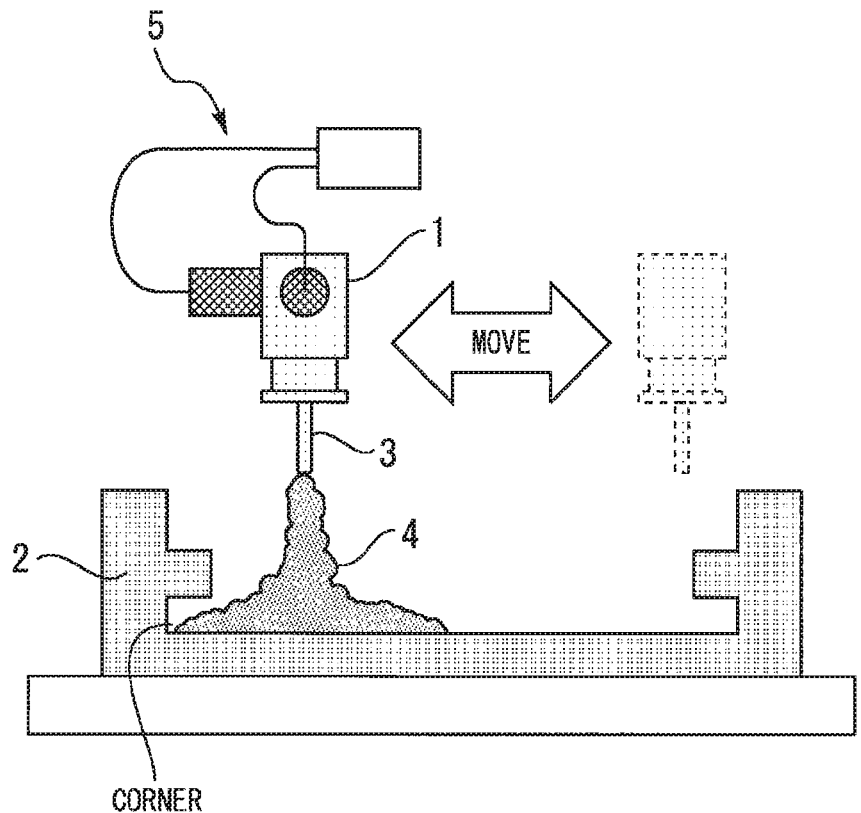
FIG. 1 is a cross-sectional view illustrating an injection device according to a first embodiment.

FIG. 1 is a cross-sectional view illustrating an injection device according to a first embodiment. An injection nozzle 1 is positioned above a target container 2, and injects an injection agent 4 discharged from a nozzle head 3 into the target container 2. During the injection of the injection agent 4, a vibration generating device 5 vibrates the injection nozzle 1 in a plurality of directions. For example, the frequency of the vibration of the injection nozzle 1 is not more than 1000 Hz, and the amplitude thereof is not more than 1 mm.

Figure 2:
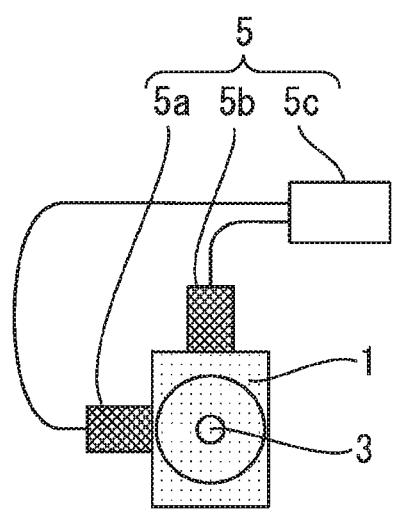
FIG. 2 is a bottom view illustrating the injection nozzle according to the first embodiment.

FIG. 2 is a bottom view illustrating the injection nozzle according to the first embodiment. The vibration generating device 5 has a plurality of vibration generators 5a and 5b provided individually at a plurality of places on the lateral surface of the injection nozzle 1, and an amplifier 5c that drives the vibration generators 5a and 5b. Herein, two vibration generators 5a and 5b are provided on the lateral surface of the injection nozzle 1, and the injection nozzle 1 is vibrated in two horizontal directions. Not limited to this, there may be provided three or more vibration generators, and the injection nozzle 1 may be vibrated in an upright direction.

Figure 3:
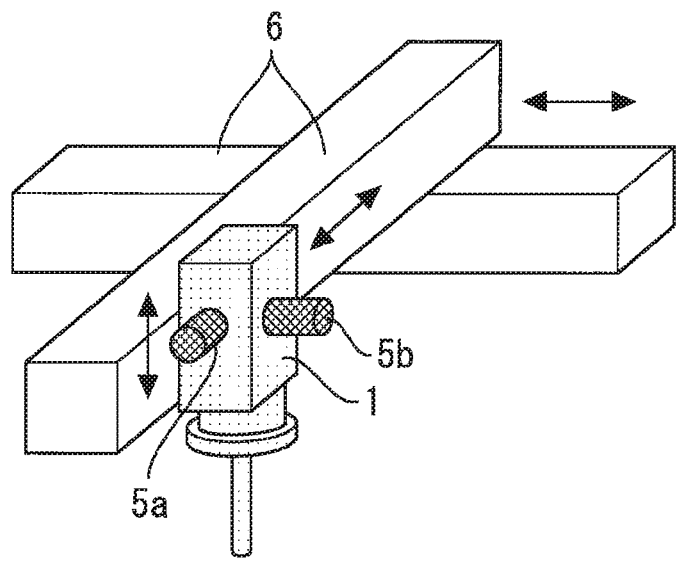
FIG. 3 is a perspective view illustrating the injection device according to the first embodiment.

FIG. 3 is a perspective view illustrating the injection device according to the first embodiment. The injection nozzle 1 is attached to perpendicular shafts 6, and is movable in the vertical and horizontal directions while injecting the injection agent 4. For example, the injection agent 4 is injected into the target container 2 while the injection nozzle 1 being moved in a circle above the target container 2. Thereby, the injection agent 4 can be evenly injected into the target container 2.

As described above, in the present embodiment, the vibration generating device 5 vibrates the injection nozzle 1 in a plurality of directions during injection of the injection agent 4. The injection agent 4 is thereby vibrated to form waves therein, which thereby leads to good fluidity thereof even when the injection agent 4 is highly viscous. Accordingly, since the injection agent 4 rapidly spreads, an injection time of a highly viscous injection agent can be reduced.

Figure 4:
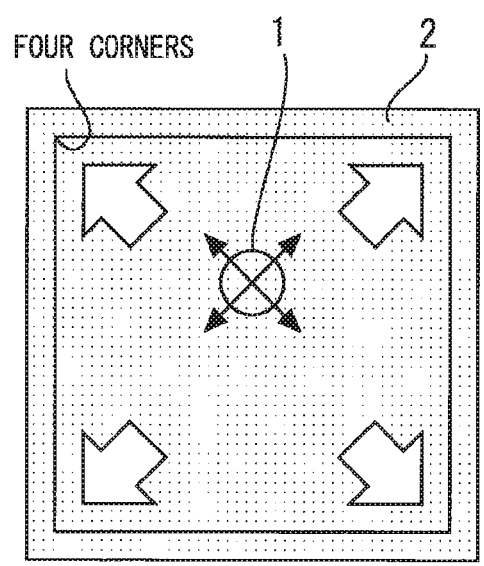
FIG. 4 is a top view exemplarily illustrating a target container.

FIG. 4 is a top view exemplarily illustrating a target container. The injection agent 4 is injected, for example, into a box-shaped target container 2 while the injection nozzle 1 being vibrated in directions at 45° relative to the sides of the box-shaped target container 2. By vibrating the injection agent 4 as above, the injection agent 4 is easy to enter the four corners of the box-shaped target container 2. Notably, also when the target container 2 is circular, by vibrating the injection nozzle 1, the injection agent 4 is easy to enter the corner of the target container 2. Since the injection agent 4 easily enters the corner of the target container 2 and the four corners of the box-shaped target container 2 as above, bubbles can be suppressed from remaining in the target container 2.

Notably, the injection device according to the present embodiment can be used for manufacturing a semiconductor device. In this case, the target container 2 is a casing for the semiconductor device, and the injection agent 4 is sealing resin. Not limited to this, note that the injection device according to the present embodiment can be used for manufacturing other devices to obtain the similar effects.

Second Embodiment

Figure 5:
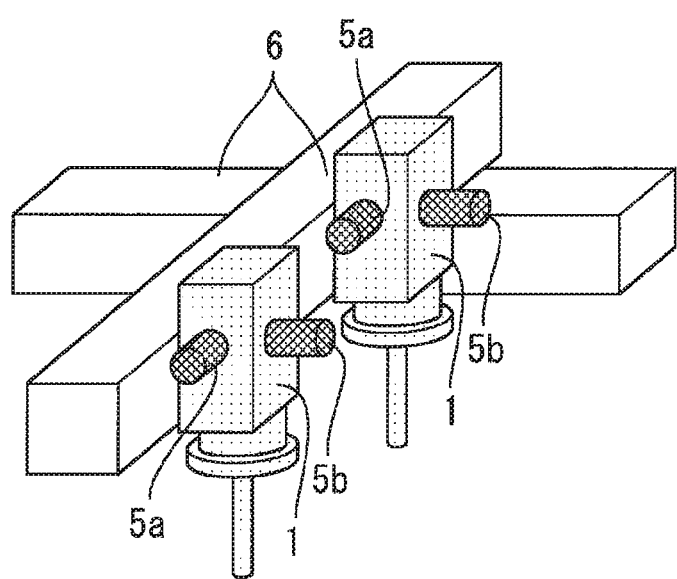
FIG. 5 is a perspective view illustrating an injection device according to a second embodiment.

FIG. 5 is a perspective view illustrating an injection device according to a second embodiment. Two injection nozzles 1 are provided side by side on the perpendicular shafts 6. Notably, there may be provided three or more injection nozzles. The plurality of vibration generators 5a and 5b are provided on each of the plurality of injection nozzles 1. By simultaneously discharging the injection agent 4 from the plurality of injection nozzles 1, a large amount of injection agent 4 can be injected at the same time.

Obviously many modifications and variations of the present invention are possible in the light of the above teachings. It is therefore to be understood that within the scope of the appended claims the invention may be practiced otherwise than as specifically described.

The entire disclosure of Japanese Patent Application No. 2018-044294, filed on Mar. 12, 2018 including specification, claims, drawings and summary, on which the Convention priority of the present application is based, is incorporated herein by reference in its entirety.

The invention claimed is:

1. An injection device comprising:
an injection nozzle injecting an injection agent into a target container; and
a vibration generating device vibrating the injection nozzle in a plurality of directions during injection of the injection agent to vibrate the injection agent and form waves in the injection agent; wherein
the vibration generating device has a plurality of vibration generators and an amplifier connected to the plurality of vibration generators to drive the plurality of vibration generators;
the plurality of vibration generators each vibrate in a different direction;
the plurality of vibration generators are spaced from each other at a plurality of places on a lateral surface of the injection nozzle such that none of the plurality of vibration generators are in contact with each other, and such that a first one of the plurality of vibration generators is disposed perpendicular to a second one of the plurality of vibration generators; and
the injection nozzle and vibration generating device are movable in a vertical direction and in a horizontal direction while injecting the injection agent such that the injection agent is injected into the target container while the injection nozzle and vibration generating device are moved in a circle above the target container.

2. The injection device according to claim 1, wherein the plurality of vibration generators are provided individually at the plurality of places on the lateral surface of the injection nozzle.

3. The injection device according to claim 2, wherein frequency of vibration of the injection nozzle is not more than 1000 Hz.

4. The injection device according to claim 3, wherein the injection nozzle is movable in vertical and horizontal directions while injecting the injection agent.

5. The injection device according to claim 4, wherein the injection nozzle includes a plurality of nozzles provided side by side.

6. The injection device according to claim 3, wherein the injection nozzle includes a plurality of nozzles provided side by side.

7. The injection device according to claim 2 wherein the injection nozzle is movable in vertical and horizontal directions while injecting the injection agent.

8. The injection device according to claim 7, wherein the injection nozzle includes a plurality of nozzles provided side by side.

9. The injection device according to claim 2, wherein the injection nozzle includes a plurality of nozzles provided side by side.

10. The injection device according to claim 1, wherein frequency of vibration of the injection nozzle is not more than 1000 Hz.

11. The injection device according to claim 10, wherein the injection nozzle is movable in vertical and horizontal directions while injecting the injection agent.

12. The injection device according to claim 11, wherein the injection nozzle includes a plurality of nozzles provided side by side.

13. The injection device according to claim 10, wherein the injection nozzle includes a plurality of nozzles provided side by side.

14. The injection device according to claim 1, wherein the injection nozzle is movable in vertical and horizontal directions while injecting the injection agent.

15. The injection device according to claim 14, wherein the injection nozzle includes a plurality of nozzles provided side by side.

16. The injection device according to claim 1, wherein the injection nozzle includes a plurality of nozzles provided side by side.

17. An injection method wherein when an injection nozzle injects an injection agent into a target container, the injection nozzle is vibrated in a plurality of directions by a vibration generating device having a plurality of vibration generators to vibrate the injection agent and form waves in the injection agent and an amplifier connected to the plurality of vibration generators to drive the plurality of vibration generators, wherein the plurality of vibration generators each vibrate in a different direction, and the plurality of vibration generators are spaced from each other at a plurality of places on a lateral surface of the injection nozzle such that none of the plurality of vibration generators are in contact with each other, and such that a first one of the plurality of vibration generators is disposed perpendicular to a second one of the plurality of vibration generators; and
the injection nozzle and vibration generating device are moved in a vertical direction and in a horizontal direction while injecting the injection agent such that the injection agent is injected into the target container while the injection nozzle and vibration generating device are moved in a circle above the target container.

18. An injection device comprising:
an injection nozzle injecting an injection agent into a target container; and
a vibration generating device vibrating the injection nozzle in a plurality of directions during injection of the injection agent to vibrate the injection agent and form waves in the injection agent; wherein the vibration generating device has a plurality of vibration generators and an amplifier connected to the plurality of vibration generators to drive the plurality of vibration generators;

the plurality of vibration generators each vibrate in a different direction;

the plurality of vibration generators are spaced from each other at a plurality of places on a lateral surface of the injection nozzle such that none of the plurality of vibration generators are in contact with each other, and such that a first one of the plurality of vibration generators is disposed perpendicular to a second one of the plurality of vibration generators; and the injection nozzle and vibration generating device are attached to a plurality of perpendicular shafts for moving the injection nozzle and vibration generating device in a vertical direction and in a horizontal direction while injecting the injection agent, such that the injection agent is injected into the target container while the injection nozzle is moved in a circle above the target container.

\* \* \* \* \*